United States Patent [19]
Sandford et al.

[11] Patent Number: 5,945,516
[45] Date of Patent: Aug. 31, 1999

[54] THERMODYNAMICALLY STABLE PHOTOACTIVE COMPOUND

[75] Inventors: Harold F. Sandford, Groton; Anthony Zampini, Westborough, both of Mass.

[73] Assignee: Shipley Company, L.L.C., Marlborough, Mass.

[ * ] Notice: This patent is subject to a terminal disclaimer.

[21] Appl. No.: 09/082,435

[22] Filed: May 20, 1998

Related U.S. Application Data

[63] Continuation of application No. 08/614,279, Mar. 12, 1996.

[51] Int. Cl.$^6$ .......................... C07C 245/12; G03F 7/023
[52] U.S. Cl. .......................... 534/557; 430/192; 430/193
[58] Field of Search .................................. 430/192, 193, 430/165; 534/556, 557

[56] References Cited

U.S. PATENT DOCUMENTS

| | | | |
|---|---|---|---|
| 4,863,828 | 9/1989 | Kawabe et al. | 430/191 |
| 5,087,548 | 2/1992 | Hosaka et al. | 430/192 |
| 5,110,706 | 5/1992 | Yumoto et al. | 430/191 |
| 5,238,775 | 8/1993 | Kajita et al. | 430/192 |
| 5,290,658 | 3/1994 | Uenishi et al. | 430/192 |
| 5,378,586 | 1/1995 | Uetani et al. | 430/192 |
| 5,380,618 | 1/1995 | Kokubo et al. | 430/190 |
| 5,397,679 | 3/1995 | Ueda et al. | 430/270.1 |
| 5,407,778 | 4/1995 | Uetani et al. | 430/192 |
| 5,429,904 | 7/1995 | Nagase et al. | 430/192 |
| 5,429,905 | 7/1995 | Tan et al. | 430/192 |
| 5,821,345 | 10/1998 | Sandford et al. | 534/557 |

FOREIGN PATENT DOCUMENTS

| | | |
|---|---|---|
| 0 443 820 A2 | 8/1991 | European Pat. Off. . |
| 0 554 101 A1 | 8/1993 | European Pat. Off. . |
| 0 555 861 A1 | 8/1993 | European Pat. Off. . |
| 0 582 309 A2 | 2/1994 | European Pat. Off. . |

*Primary Examiner*—John S. Chu
*Attorney, Agent, or Firm*—Darryl P. Frickey; Peter F. Corless; Dike, Bronstein, Roberts & Cushman, LLP

[57] ABSTRACT

A method for converting a kinetically stable multiester of a naphthoquinone and an o-quinone diazide sulfonyl halide to a thermodynamically stable compound. The method comprises the steps of dissolving a phenol having at least two free phenolic hydroxyl groups and an o-naphthoquinone diazide sulfonyl halide in an aprotic solvent in the presence of a strong base, there being at least one mole of said naphthoquinone diazide sulfonyl halide per mole of phenol, reacting said phenol with said o-napthoquinone diazide sulfonyl halide until essentially of said o-naphthoquinone diazide sulfonyl halide is reacted with said polyhydroxy phenol, and following completion of said reaction, permitting the reaction product to remain in said solvent for a period of time of at least 15 minutes before recovering said photoactive compound The photoactive compound formed by the process is suitable for the formation of photoresists and is less apt to precipitate from solution during storage.

10 Claims, No Drawings

THERMODYNAMICALLY STABLE PHOTOACTIVE COMPOUND

This application is a continuation of copending application Ser. No. 08/614,279 filed on Mar. 12, 1996 and which designated the U.S.

BACKGROUND OF THE INVENTION

I. Introduction

This invention relates to modified light sensitive materials for photoresist compositions. More particularly, this invention relates to photoactive compounds that are thermodynamically stable esterification products of polyhydroxy phenols and o-quinone diazide sulfonyl compounds characterized by improved solubility in organic solvents and at least two o-quinone diazide sulfonyl groups substituted on the phenol.

II. Description of the Prior Art

Photoresist compositions are well known in the art and described in numerous publications including DeForest, *Photoresist Materials and Processes*, McGraw-Hill Book Company, New York, 1975. Photoresist coating compositions are applied from liquid solution or as a dry film. When coated onto a substrate and exposed to light of the proper wavelength, are chemically altered in their solubility to certain solvents (developers). Two types are known. The negative-acting resist is initially a mixture which is soluble in its developer, but following exposure to activating radiation, becomes insoluble in developer thereby defining a latent image. Positive-acting resists work in the opposite fashion, light exposure making the resist soluble in developer.

Positive-working photoresists are more expensive than negative-working photoresists but are capable of providing superior image resolution. The greater expense of the positive working photoresist is due primarily to the cost of the photoactive compound used to formulate the photoresist. However, notwithstanding the higher cost of the positive photoresist, such materials are in substantial commercial use due to image resolution superior to negative acting photoresists. For example, positive-working photoresist using o-quinone diazide sulfonic acid ester photoactive compound can be developed to yield relief images having line widths of one micron or less. In addition, considering the cross section of a photoresist image, the channels formed in the resist by development have square corners and sidewalls with only minimal taper.

The positive-working photoresists typically comprise a light-sensitive component in a film-forming alkali soluble thermoplastic polymer binder. The light-sensitive compounds or photoactive compounds most frequently used are esters formed from o-quinone diazide sulfonic acids. These esters are well known in the art and are described by DeForest, supra, pages 47–55, incorporated herein by reference. Photoactive compounds and the methods used to make the same are well documented in prior patents including German Pat. No. 865,140 granted Feb. 2, 1953 and U.S. Pat. Nos. 2,767,092; 3,046,110; 3,046,112; 3,046,119; 3,046,121; 3,046,122; and 3,106,465, all incorporated herein by reference. Additional photoactive compounds that have been used in the formulation of positive-acting photoresists are shown in U.S. Pat. No. 3,637,384, also incorporated herein by reference. These materials are formed by reaction of a suitable diazide of an aromatic sulfonyl chloride with an appropriate resin amine. Methods for the manufacture of these photoactive compounds and examples of the same are shown in U.S. Pat. No. 2,797,213, incorporated herein by reference. Other positive-working diazo compounds have been used for specific purposes. For example, a diazo compound used as a positive-working photoresist for deep UV lithography is Meldrum's diazo and its analogs as described by Clecak et al, *Technical Disclosure Bulletin*, Volume 24, Number 4, September 1981, IBM Corporation, pp. 1907 and 1908. An o-quinone diazide compound suitable for laser imaging is shown in U.S. Pat. No. 4,207,107. The aforesaid references are also incorporated herein by reference.

The resin binders most frequently used with the o-quinone diazide photoactive compounds in commercial practice are the alkali soluble phenol formaldehyde resins known as the novolak reins. Photoresists using such polymers are illustrated in U.K. Pat. No. 1,110,017, incorporated herein by reference. These materials are the product of reaction of a phenol with formaldehyde under conditions whereby a thermoplastic polymer is formed with a glass transition temperature of about 100° C. Novolaks with glass transition temperatures in excess of 100° C. are also known and exemplified in U.S. Pat. No. 5,266,440, which discloses novolak resins comprising the product resulting from the acid condensation of an aromatic aldehyde with a phenol resulting in resins having a molecular weight in excess of 1,500 Daltons and glass transition temperatures in excess of 125° C. Another class of binders used with such photoresists are homopolymers and copolymers of vinyl phenol. Photoresists of this nature are disclosed in U.S. Pat. No. 3,869,292, supra.

In the prior art, the above-described positive resists using alkali soluble phenolic resins as a binder are most often used as masks to protect substrates from chemical etching in photo-engraving processes. For example, in a conventional process for the manufacture of a printed circuit board, a copper-clad substrate is coated with a layer of a positive-working photoresist, exposed to actinic radiation to form a latent circuit image in the photoresist coating, developed with a liquid developer to form a relief image and etched with a chemical etchant whereby unwanted copper is removed and copper protected by the photoresist mask is left behind in a circuit pattern. For the manufacture of printed circuit boards, the photoresist must possess chemical resistance, must adhere to the circuit board substrate, and for high density circuits, must be capable of fine-line image resolution.

Similar photoresists are also used in the fabrication of semiconductors. As in the manufacture of printed circuits, the photoresist is coated onto the surface of a semiconductor wafer and then imaged and developed. Following development, the wafer is typically etched with an etchant whereby the portions of the wafer bared by development of the photoresist are dissolved while the portions of the wafer coated with photoresist are protected, thereby defining a circuit pattern. For use in the manufacture of a semiconductor, the photoresist must possess resistance to chemical etchants, must adhere to the surface of the semiconductor wafer and must be capable of very fine-line image resolution.

To fabricate devices requiring fine-line resolution, it is necessary to use photoresist compositions that are capable of submicron resolution. It is known in the art that high resolution is achieved using photoactive compounds that are mulitesters of naphthoquinone diazide sulfonic acid halides and large polyhydroxy compounds. Though high ester levels of the naphthoquinone diazide sulfonic acid substituent improves image resolution, a high level of esterification may create problems in the manufacture and use of the photoresist. For example, it is known that photoresists formed using multiesters may unexpectedly insolubilize in a photoresist composition resulting in particle formation. Particles cannot be tolerated in photoresists requiring submicron resolution capability. It is also known that the tendency to form particles is greater with photoactive compounds having large molecules and multiple esterified hydroxyl groups. In addition, it is known that efforts to esterify such phenols generally result in a reaction product that is a mixture of photoactive compounds. For example, if a phenol having five phenolic groups is esterified with three moles of a naphthoquinone diazide sulfonyl halide, the resultant product may have an average of about three ester groups per molecule of phenol, but the actual reaction product is likely to be a mixed ester comprising pentaester, tetraester, triester, diester, monoester and unreacted phenol, dependent upon reaction conditions, with the average number of ester groups in the mixture being three ester groups per molecule. It is further known that the higher esterification products, for example the pentaester and tetraester, especially those esterification products having a symmetrical structure, are especially susceptible to particle formation in solution.

Methods proposed in the prior art to prevent particulate formation of a naphthoquinone diazide sulfonic acid halide ester photoactive compound during storage is disclosed in U.S. Pat. No. 4,732,837 and in published Japanese Patent Application H15-83543 published Nov. 26, 1993, both incorporated herein by reference. In accordance with the procedure disclosed therein, unesterified hydroxyl groups—those not reacted with a naphthoquinone diazide sulfonyl halide, are reacted with an acylation or sulfonylation agent thereby chemically inactivating the hydroxyl groups with a concomitant decrease in the tendency of these materials to precipitate from solution during storage. Though it is believed that the process improves shelf life of a photoresist as reported, it is also believed that free hydroxyl groups are important to photospeed and dissolution of unexposed photoresist in developer. Consequently, acylation or sulfonylation of the hydroxyl groups decreases dissolution rate of an exposed photoresist thereby retarding the rate of development or requiring an increase in exposure dose for equivalent development speed.

SUMMARY OF THE INVENTION

The subject invention is based upon at least two discoveries. The first discovery is the recognition that the symmetry of a multiester of a polyhydroxy phenol and a naphthoquinone diazide sulfonic acid halide following its formation may lead to its precipitation from solution during storage. The second discovery is that such esterification products formed by reacting a naphthoquinone diazide sulfonyl halide with a polyhydroxy phenol are kinetically stable, but they are not thermodynamically stable and will rearrange under appropriate conditions whereby the symmetry of the multiester compounds, and their tendency to precipitate, is significantly reduced.

In accordance with the invention, it has been found that following completion of the reaction leading to the formation of the esterification product of a polyhydroxy phenol and a naphthoquinone diazide sulfonyl halide, the ester groups will transesterify or equilibrate into a more thermodynamically stable, less symmetrical form if dissolved and permitted to stand in a highly polar aprotic solvent in the presence of a relatively strong base. By permitting the photoactive compounds to equilibrate in accordance with the procedures of the invention, photoactive compounds are provided which have enhanced solubility in photoresist solvents and a reduced tendency to precipitate during storage.

It is a further discovery of this invention that a photoactive compound having a given number of diazo naphthoquinone ester groups may have that number altered by equilibration of the photoactive compound with another photoactive compound having a different number of ester groups or with an unesterified phenol. The mixture of compounds are equilibrated using the procedures of the invention including dissolving the mixture in an aprotic solvent in the presence of a base and permitting the equilibration reaction to take place. In yet another discovery of this invention, it has been found that transesterification or equilibration may take place between different ester groups provided that there are some free hydroxy groups available. For example, those photoactive compounds which have been acylated or sulfonylated in accordance with the procedure of U.S. Pat. No. 4,732,837 above may be esterified or equilibrated in a similar manner wherein the acylated or sulfonylated photoactive compound is admixed with a different photoactive compound and the two permitted to equilibrate to produce a composition that is of increased thermodynamic stability.

DESCRIPTION OF THE PREFERRED EMBODIMENTS

In accordance with the invention, a naphthoquinone diazide sulfonic acid halide is esterified with a polyhydroxy phenol or polyphenol in conventional manner. The polyhydroxy phenol desirably has at least two phenolic hydroxyl groups. Polyhydroxy phenols are disclosed in U.S. Pat. Nos. 4,863,828; 5,087,548; 5,110,706; 5,238,775; 5,290,658; 5,380,618; 5,397,679; 5,407,778; 5,429,904 and 5,429,905 and in European published applications Nos. 0 443 820; 0 554 101; 0 555 861 and 0 582 309, each incorporated herein by reference for disclosure of suitable polyhydroxy phenols in accordance with this invention. A preferred polyhydroxy phenol is preferably a phenol conforming to the following general formula:

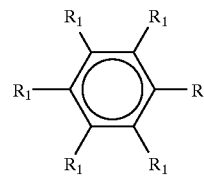

where $R^1$ is hydrogen, halogen, lower, alkyl having from 1 to 4 carbon atoms, or hydroxyl; R is selected from the group of hydrogen, hydroxyl, or

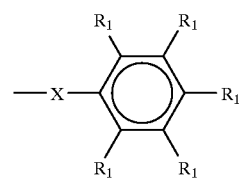

where X is a single C—C bond, —O—, —S—, —SO$_2$—, —C—, or —(CR$^2{}_2$)— where each $R^2$ is individually hydrogen, lower alkyl having from 1 to 4 carbon atoms, mononuclear aryl or

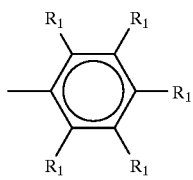

where each $R^1$ is as defined above;
provided that at least 2 and preferably 3 $R_1$, s are hydroxyl.

Polyhydroxy compounds conforming to the above general formula include, without limitation, polyhydroxy benzenes such as resorcinol, pyrogallol, and glucinol; polyhydroxy phenylalkylketones such as 2,4-dihydroxy phenolpropylketone, 2,4-dihydroxy phenyl-n-hexylketone, and 2,3,4-trihydroxy phenyl-m-hexylketone; polyhydroxy phenalylketones such as 2,4-dihydroxy benzophenone, 2,3,4-trihydroxy benzophenone, 2,4,6-trihydroxy benzophenone, 2,4,2',4'-tetrahydroxy benzophenone, 2,3,4,4'-tetrahydroxy benzophenone, 2,3,4,2',4'-pentahydroxy benzophenone, 2,3,4,2',6'-pentahydroxy benzophenone, 2,3,4,3',4',5'-hexahydroxy benzophenone, 2,4,6,3',4',5'-hexahydroxy-5-chloro benzophenone, and 2,3,4,3',4',5'-hexahydroxy-5-benzyl benzophenone, bis(polyhydroxy phenyl) alkanes such as bis (2,4dihydroxy phenyl) methane, 2,2-bis(2,4-dihydroxy phenyl) propane and 2,2-bis(2,3,4-trihydroxy phenyl) propane, alkyl polyhydroxy benzoic ester or alkyl polyhydroxy benzoic ester such as propyl 3,4,5-trihydroxy benzoic ester and phenyl, 3,4,5-trihydroxy benzoic ester, bis(polyhydroxy benzyl) alkanes such as bis(2,4-dihydroxy benzyl) methane, bis (2,3,4-trihydroxy benzyl) methane, bis (2,4,6-trihydroxy benzyl) methane, and 2,2-bis(2,3,4-trihydroxy phenyl) propane, bis(polyhydroxy benzyl) benzenes such as p-bis(2,5-dihydroxy benzyl) benzene, bis (2,4-dihydroxy benzyl)-p-cresol, p-bis(2,3,4-trihydroxy benzyl) benzene and p-bis(2,4,6-trihydroxy benzyl) benzene, alkanediol di(polyhydroxy benzoate) such as ethyleneglycol di(3,5-dihydroxy benzoate), ethyleneglycol di(3,4,5-trihydroxy benzoate), 1,4-butanediol(3,4,5-trihydroxy benzoate) and 1,8 octanediol di (3,4,5-trihydroxy benzoate), polyethyleneglycol di (polyhydroxy benzoate) such as diethylene glycol di (3,4,5-trihydroxy benzoate) and triethyleneglycol di (3,4,5-trihydroxy benzoate), α-pyrone type natural color matters having hydroxyl groups such as hispydine, glubeldine, g-pyrone type natural color matters such as chricine, apigenin, quercetin, rutin, morin, nalingenin and purnetin, diazine type natural color matters such as leucopterine, entropterine, chrisopterine and iodinin, quinone type natural color matters such as atromenthyn, muscurphine, eugron, alizarne, purpurine and akirine, and resins having hydroxyl groups such as poly (hydroxystyrene), alkali-soluble novolak reins, and pyrogallol-acetone condensation resin may be mentioned.

To make a photoactive compound, the polyhydroxy compound is esterified with an o-quinonediazide sulfonyl compound. Examples of suitable o-naphthoquinonediazide groups include a 1,2-naphthoquinonediazide-4-sulfonyl group, a 1,2-naphthoquinonediazide-5-sulfonyl group, a 2,1-naphthoquinonediazide-4-sulfonyl group, a 2,1-naphthoquinonediazide-6-sulfonyl group, a 2,1 - naphthoquinonediazide-7-sulfonyl group, and a 2,1 - naphthoquinonediazide-8-sulfonyl group. These groups may be used alone or in combination as a mixture. Among these groups, a 1,2-naphthoquinonediazide-4-sulfonyl group and a 1,2-naphthoquinonediazide-5-sulfonyl group are particularly preferred.

In accordance with one embodiment of the invention, the polyhydroxy compound is condensed with the o-naphthoquinone diazide sulfonyl chloride in conventional manner and then equilibrated, or is condensed with the o-naphthoquinone diazide sulfonyl chloride in a modification of the conventional manner.

In the conventional method for forming the light sensitive compound, the polyhydroxy phenol and the o-naphthoquinone diazide sulfonyl chloride are dissolved in a solvent in the presence of a mild base and the reaction between the components is monitored and permitted to continue until the reaction is complete as evidenced by the absence of free o-naphthoquinone diazide sulfonyl halide. Thereafter, the photoactive compound formed recovered using conventional procedures.

If the above procedure is used to form the photoactive compound, then in accordance with the invention, following its recovery, the photoactive compound reaction product is equilibrated by dissolving the photoactive compound in an aprotic solvent having a polarity index of at least 3.5 and preferably 4, as determined by Snyder in Journal of Chromatography Science, Volume 16, 1978, p 223 incorporated herein by reference, together with the addition of a strong base. Desirably, the base has a $pK_a$ of at least 9.0 and preferably at least 12.0. To conduct the equilibration reaction, the photoactivated compound must have some free hydroxyl groups. Desirably, the molar ratio of ester groups to free hydroxyl does not exceed 20 to 1 and preferably varies from about 10 to 1 to 1 to 1. The concentration of the photoactive compound in the solvent may vary from about 2 to 50 w/w percent and preferably varies from about 5 to 35 w/w percent. The strong base may be added in an amount of from 1 to 50 w/w percent and preferably in an amount of from 5 to 25 w/w percent. The base is slowly added to the reaction mixture This is followed by a reaction period at a constant temperature until equilibration is completed. A preferred reaction temperature may vary from about 15 to 60° C. and preferably varies between 20 and 40° C. The transesterification or equilibration reaction is permitted to continue for from about 15 minutes to 8 hours, but preferably takes place over a period of time of from about 30 minutes to 4 hours. During this time, the ester groups will rearrange themselves into a more thermodynamically stable arrangement which is generally less symmetrical then their arrangement prior to equilibration.

In a modification of the conventional process, prior to esterification of the polyhydroxy phenol with the naphthoquinone diazide sulfonyl halide, the reactants are initially dissolved in an aprotic solvent together with the strong base. The reaction is initiated and permitted to continue to completion with monitoring. Upon completion of the reaction, it may be necessary to add additional base. The reaction product is then permitted to equilibrate using the procedures and conditions described above.

In accordance with another embodiment of the invention, a kinetically stable photosensitive compound may be equilibrated with (1) another photoactive compound, (2) with an unesterified polyhydroxy phenol, (3) with another ester of a phenol which may or may not contain naphthoquinone diazide ester groups, or (4) any combination of the foregoing, to alter the average number of ester groups in the photoactive compound mixture. For example, a photoactive compound having an average of 3 ester groups may be equilibrated with a photoactive compound having an average of two ester groups to obtain a third more thermodynamically stable mixture having an average number of ester groups between two and three dependent upon the molar ratio of the two components. To equilibrate a mixture of compounds as described above, the mixed esters or ester and phenol are dissolved in the aprotic solvent, admixed with the base and permitted to equilibrate using the procedures and conditions described above.

When equilibrating any mixture of materials as described above, any of the photoactive components may have a portion of their free hydroxyl groups esterified with an acylation agent or a sulfonylation agent in accordance with procedures such as those disclosed in U.S. Pat. No. 4,732, 837 and published Japanese patent application H5, -83543 identified above provided, as described above, some free hydroxyls remain on at least one of the reactants, to enable the transesterification reaction to proceed to thermodynamic completion.

Representative aprotic solvents that may be used in the above reaction include acetone, tetrahydrofurane, dioxane, methylethyl ketone, dimethylacetamide, dimethylformamide, gamma butyrolactone, propylene carbonate, dimethylsulfoxide, etc.

Representative bases that may be used in the above reaction include alkylamines such as trimethylamine, dimethylethyl amine, tripropyl amine, ethyl dimethyl amine, dimethyl amino pyridine, dimethyl morpholine, dimethyl guanidine, sodium potassium carbonate, sodium hydroxide, etc. Trialkyl amines are preferred.

The photoactive compounds prepared in accordance with the invention are used to form photoresists in the same manner as conventional photoactive compounds. The photoresist is prepared by dissolution of the photoactive compound and an alkali soluble resin in a solvent. Typical alkali soluble resins are phenolic resins such as a novolak resins or polyvinyl phenol resins.

Procedures for the preparation of conventional novolak and poly(vinylphenol) resins used as photoresist binders are well known in the art and disclosed in numerous publications. Novolak resins are the thermoplastic condensation products of a phenol and an aldehyde. Examples of suitable phenols for condensation with an aldehyde, especially formaldehyde, for the formation of novolak resins include phenol, m-cresol, o-cresol, p-cresol, 2,4-xylenol, 2,5-xylenol, 3,4-xylenol, 3,5-xylenol, 2,3,5-trimethylphenol and thymol. An acid catalyzed condensation reaction results in the formation of a suitable novolak resin which may vary in molecular weight from about 500 to 100,000 daltons. The preferred novolak resins conventionally used for the formation of photoresists are the cresol-xylenol formaldehyde condensation products.

Poly(vinylphenol) resins are thermoplastic polymers that may be formed by block polymerization, emulsion polymerization or solution polymerization of the corresponding monomers in the presence of a cationic catalyst. Vinylphenols useful for the production of poly(vinylphenol) resins may be prepared, for example, by hydrolysis of commercially available coumarin or substituted coumarins, followed by decarboxylation of the resulting hydroxy cinnamic acids. useful vinylphenols may also be prepared by dehydration of the corresponding hydroxy alkyl phenols or by decarboxylation of hydroxy cinamic acids resulting from the reaction of substituted or non-substituted hydroxybenzaldehydes with malonic acid. Preferred poly(vinylphenol) resins prepared from such vinylphenols have a molecular weight range of from about 2,000 to about 100,000 daltons.

Other suitable phenolic resins include polystyrenes and copolymers of phenol and cyclic alcohols. The copolymer of a phenol and a cyclic alcohol may be formed by copolymerizing a phenol with a cyclohexanol or by hydrogenating a known phenolic resin. Details for the formation of such copolymers are disclosed in U.S. Pat. No. 5,258,257, incorporated herein by reference.

A preferred class of alkali soluble resins are the aromatic novolak resin which are formed by condensing a phenol with a functional aromatic reactant capable of reacting with said phenol such as an aromatic aldehyde, a bis-hydroxymethylated phenol, or the combination of an aromatic aldehyde and a bis-hydroxymethylated phenol to form a novolak resin. The term also includes within its scope aromatic novolak resins further reacted with an additional aldehyde or a functional aromatic reactant alone or in combination with additional phenols to form alternating or block copolymers.

A method for the formation of an aromatic novolak resin by reaction of a phenol with an aromatic aldehyde is disclosed in U.S. Pat. No. 5,216,111, incorporated herein by reference. In accordance with the procedure of that patent, the aromatic novolak resins are acid catalyzed condensation products of one or more phenols and an aromatic aldehyde formed by the condensation of the reactants in the presence of a strong organic or mineral acid optionally in the presence of a divalent sulfur compound as a co-catalyst under reaction conditions set forth in the above-referenced patent. The phenol is of the type conventionally used in the formation of novolak resins, such as, for example, phenol itself, the cresols, xylenols, resorcinols, naphthol, bisphenols such as 4,4'-isopropylidenebiphenol and mixtures of such phenols. Preferred phenols for purposes of the invention include the cresols, m-cresol being most preferred because it yields a polymer having a narrow molecular weight distribution.

The aromatic novolak resin is desirably formed by condensation of the phenol with an aromatic aldehyde. Preferred aromatic aldehydes are those where a hydroxyl group is in a position ortho to the carbonyl group. Most preferred aromatic aldehydes are salicylaldehyde, benzaldehyde and mixtures of the two. Other aromatic aldehydes suitable for purposes of the invention include 2-chlorobenzaldehyde, 3-hydroxy benzaldehyde, 4-hydroxybenzaldehyde, 2-methoxybenzaldehyde, 3-nitrobenzaldehyde, etc. Mixtures of aromatic aldehydes may also be used. In a lesser preferred embodiment, the aromatic aldehyde may be mixed with formaldehyde or a formaldehyde precursor such as paraformaldehyde or an alkylaldehyde such as acetaldehyde or its acetals if desired. however, the aromatic aldehyde preferably is in molar excess of formaldehyde, more preferably comprises at least 90% by weight of the aldehyde mixture, and most preferably is the only aldehyde used to form the resin.

The aromatic novolak resins are formed by condensing the phenol with the aromatic aldehyde in the presence of an acid. The molar concentration of the aromatic aldehyde may be slightly less than that of the phenol, but unexpectedly, may also be equivalent to or slightly in excess of the phenol without formation of a crosslinked resin. In this respect, the ratio of the phenol to the aromatic aldehyde may vary between about 1.1 to 1.0 and 1.0 to 1.1

Aromatic aldehydes, compared to formaldehyde, are less reactive towards condensation reactions leading to polymerization. However, under more vigorous reaction conditions, aromatic aldehydes can condense with a reactive phenol in the presence of a strong mineral or organic acid such as hydrochloric acid, sulfuric acid, or toluene sulfonic acid. The condensation of the aromatic aldehyde with a reactive phenol results in the formation of polymers that are of high molecular weight typically having a weight average molecular weight in excess of 1500 Daltons and often in excess of 2500 Daltons. Further, with respect to molecular weight, it has been found that the aromatic novolak resins have a narrower molecular weight distribution compared to novolak resins formed using formaldehyde as the condensation reactant. In addition to increased molecular weight, the resins have improved glass transition temperatures generally in excess of 125° C. and often in excess of 175° C.

An alternative method for formation of the aromatic novolak resin comprises reaction of a reactive phenol with a bis-hydroxymethyl phenol in accordance with the procedures set forth in U.S. Pat. No. 5,238,776, incorporated herein by reference. The procedure may be conducted in the absence of an aldehyde or in the presence of an aldehyde such as an aromatic aldehyde.

The bishydroxymethyl phenols may be formed by the reaction of formaldehyde with a phenol in the presence of a base. Suitable phenols include o-cresol, m-cresol, p-cresol, phenol, 2-phenylphenol, 3-phenylphenol, 4-phenylphenol, 2,3-dimethylphenol, 3,4-dimethylphenol, 3,5-dimethylphenol, 2,3,5-trimethylphenol, 3,4,5-trimethylphenol, p-ethylphenol, p-propylphenol, p-butylphenol, p-nonylphenol, p-tolylphenol, broinophenols, fluorophenols, chlorophenol, trimethylsilylphenol, chloromethylphenols, acylphenols, p-hydroxybenzoic acid, p-nitrophenol, bis(hydroxyphenyl)methane, isopropylidenebisphenol, biphenol, p-cresol formaldehyde dimers and trimers and the like, in the presence of a base. Suitable bases which will promote the reaction include sodium and potassium hydroxide and tetramethyl ammonium hydroxide.

The bishydroxymethyl groups of the above phenols are reactive and in the presence of heat and acid, react with each other or the ring of other reactive phenols to form alternating copolymers. Such phenols include phenol, cresols, dimethylphenols, trimethylphenols, naphthol, biphenols, phenylphenols, bisphenols, bis(hydroxyphenyl)methane, isopropylidenebisphenols, catechols, resorcinols, thiobiphenols, low molecular weight oligomers of phenols and the like, which contain at least two sites in the aromatic ring(s) of sufficient reactivity to undergo facile Friedel-Crafts reactions. The condensation reaction of the reactive phenol with the bishydroxyinethylated phenol will sustain polymerization and result in the formation of alternating copolymers. To obtain the desired alternating copolymers, the reaction is conducted in the absence of an aldehyde. If an aldehyde is present in the reaction mixture during the formation of the alternating copolymer, than a polymer is formed that contains segments having both the alternating and random copolymer features. Such a polymer is substantially an alternating block copolymer. Other alternating block copolymer structures may be formed by first reacting the reactive phenol with an aldehyde to form a random structure and then introducing into the reaction mixture the bishydroxymethylated phenolic compound and reacting it with the reactive phenol and the random polymer structure. Alternatively, the bishydroxymethylated phenol is reacted first with the reactive phenol and then an aldehyde is added to the reaction mixture containing unreacted phenol to form the alternating block copolymer. Additional alternating block copolymer structures may be formed by reacting preformed alternating copolymers with preformed random copolymers with either or both an aldehyde and a bishydroxymethylated compound with or without the presence of a reactive phenol.

In accordance with the invention, a photoresist is prepared by dissolving the photoactive component and the alkali soluble resin in a suitable photoresist solvent. Known photoresist solvents include, for example, ether esters such as ethyl cellosolve acetate, methyl cellosolve acetate, and propylene glycol monomethyl ether acetate; ether alcohols such as ethyl cellosolve, methyl cellosolve, propylene glycol monomethyl ether; carboxylates such as ethyl acetate and butyl acetate; lactones such as butyrolactone; cyclic ketones such as cyclohexanone and 2-heptanone, carboxylates of di-basic acids such as diethyloxylate and diethylmalonate; dicarboxylates of glycols such as ethylene glycol diacetate and propylene glycol diacetate; and hydroxy carboxylates such as ethyl-2-hydroxy propionate (ethyl lactate), and ethyl-3-hydroxy propionate. Solvents may be used alone or in admixture with each other and may be further mixed with non-solvents for one or more of the constituents. Suitable photoresist coating compositions can contain up to 50% by weight solids and preferably from 10 to 40% percent solids.

Other additives that may be added to the photoresist coating composition include actinic and contrast dyes, antistriation agents, plasticizers, speed enhancers, adhesion promoters and the like as would be known to those skilled in the art.

The following examples will better illustrate the method for preparation of photoactive compounds and photoresists in accordance with the invention.

EXAMPLE 1

Synthesis of DNQ triester of 2,3,4-trihydroxybenzophenone (THBP).

2,3,4-trihydroxybenzophenone (11.50g; 0.050 mole) and 2-diazo-1naphthol-5-sulfonyl chloride (40.50g; 0.150 mole; 3 equivalents) were dissolved in 220 ml. of N,N-dimethylacetamide. Triethylamine (16.67g; 0.166 mole; 10% excess relative to DNQ-sulfonyl chloride) was dissolved in 25 ml. dimethyl acetamide and added dropwise during 10 minutes. The mixture was then stirred for 30 minutes. Deionized water (4 ml) was added slowly. The mixture was stirred 5 minutes more and then made acidic by slowly adding 5 ml. of concentrated hydrochloric acid. The reaction mixture was filtered to remove triethylamine hydrochloride salts. The product was then precipitated by adding the solution to 1400 deionized water while stirring. The product was isolated by vacuum filtration, washed, air dried, and then vacuum oven dried at 40° C. for 24 hours.

Analysis by HPLC 99.2% DNQ triester of THBP.

EXAMPLE 2

Evidence of transesterification (equilibration) of a DNQ-PAC during its synthesis in a highly polar aprotic solvent.

2,3,4-trihydroxybenzophenone (23.01 g; 0.100 mole) and 2-diazo-1-naphthol-5-sulfonyl chloride (53.74g; 0.200 mole; 2 equivalents relative to THBP) were dissolved in 175 ml. N,N-dimethylacetamide and equilibrated to 25° C. Triethylarnine (22.26 g; 0.220 mole; 10% excess relative to DNQ-sulfonyl chloride) dissolved in 35 ml. dimethylacetamide was added dropwise to the reaction mixture during 22 minutes. After 15, 30, 60, 120, 180 and 240 minutes, a 10 ml aliquot was removed, made acidic with concentrated HCl, and precipitated into 300 ml deionized water. It was isolated by vacuum filtration and washed. Approximately 20 milligrams of the wet isolate was dissolved in 10 ml of tetrahydrofuran and the HPLC chromatogram run. The following table shows the results of transesterification over time.

|       | Reaction Time |        |        |         |         |         |
|-------|---------------|--------|--------|---------|---------|---------|
| Peak  | 15 min        | 30 min | 60 min | 120 min | 180 min | 240 min |
| THBP       | 3.34  | 3.19  | 3.16  | 2.95  | 2.65  | 2.32  |
| 4 monoester | 5.93  | 5.87  | 5.41  | 4.88  | 4.49  | 4.24  |
| 3 monoester | 0.63  | 0.74  | 0.93  | 1.30  | 1.56  | 1.83  |
| 3,4 diester | 7.80  | 8.78  | 9.79  | 11.43 | 12.83 | 13.54 |
| 2,4 diester | 12.37 | 12.95 | 13.92 | 15.44 | 16.61 | 17.35 |
| 2,3 diester | 1.22  | 1.59  | 2.88  | 4.63  | 6.15  | 7.39  |
| triester    | 68.71 | 66.88 | 63.91 | 59.37 | 55.71 | 53.33 |

EXAMPLE 3

Demonstration of DNQ-sulfonate ester transesterification.

3,000 grams of the DNQ triester of THBP (from example 1), 0.600 grams of 2,3,4-trihydroxy-benzophenone (THBP), and 10 ml of the solvent being investigated (gamma-butyrolactone, 1,4-dioxane, dimethylacetamide, etc.) were mixed in a 20 ml scintillation vial to achieve an homogeneous solution and equilibrated in a constant temperature bath to 30° C. A sample—(typically four drops) was removed and diluted with tetrahydrofuran and its HPLC chromatogram run. Triethylamine (0.200 grams) was added to the vial. Small aliquots were removed periodically and neutralized with HCl typically at 15, 30, 60, 120, 180 and 240 minutes) and the HPLC chromatograms run. The HPLC chromatograms demonstrated rapid transesterification between the DNQ-triester of THBP and THBP as evidenced by the loss of both initial reactants and the appearance of mono-DNQ and di-DNQ esters of THBP

We claim:

1. A method for formation of a thermodynamically stable mixture of photoactive compounds that are multiesters of polyhydroxy phenols and a naphthoquinone diazide sulfonyl halide, said method comprising the steps of dissolving a phenol having at least two free phenolic hydroxyl groups and an o-naphthoquinone diazide sulfonyl halide in an aprotic solvent in the presence of a strong base, there being at least one mole of said naphthoquinone diazide sulfonyl halide per mole of phenol, reacting said phenol with said o-napthoquinone diazide sulfonyl halide until essentially all of said o-naphthoquinone diazide sulfonyl halide is reacted with said polyhydroxy phenol, and following completion of said reaction, adding a second reactant selected from the group consisting of a naphthoquinone diazide sulfonic acid ester of a phenol having ester groups in an amount differing from the number of ester groups substituted on said multiester formed by said reaction, an unesterified polyhydroxy phenol, a non-light sensitive ester of a phenol and combinations thereof, and permitting the product to remain in said solvent for a period of time of at least 15 minutes before recovering said photoactive compounds.

2. The method of claim 1 where the polyhydroxy phenol, initially reacted with the o-naphthoquinone diazide sulfonyl halide corresponds to the following formula:

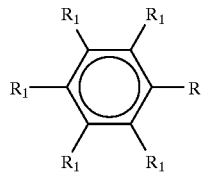

where $R^1$ is a member selected from the group consisting of hydrogen, halogen, lower, alkyl having from 1 to 4 carbon atoms, or hydroxyl; R is a member selected from the group consisting of hydrogen, hydroxyl, and

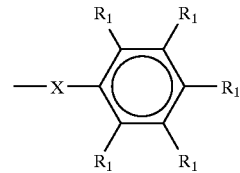

where X is a single C—C bond, —O—, —S—, —SO$_2$—, —C—, or —(CR$^2{}_2$)— where each $R^2$ is individually selected from the group consisting of hydrogen, lower alkyl having from 1 to 4 carbon atoms, mononuclear aryl or

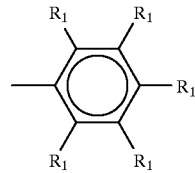

where each $R^1$ is as defined above.

3. The method of claim 1 the phenol is a hydroxybenzophenone.

4. The method of claim 3 where the phenol is a trihydroxybenzophenone.

5. The method of claim 1 where the ratio of naphthoquinone diazide sulfonic acid groups to free hydroxyl groups does not exceed 20 to 1.

6. The method of claim 5 where the ratio varies between 10 to 1 and 1 to 1.

7. The method of claim 1 where the solvent has a polarity index of at least 3.5.

8. The method of claim 7 where the polarity index is at least 4.0.

9. The method of claim 1 where the pK$_a$ of the base is at least 9.0.

10. The method of claim 1 where the reaction is conducted at a temperature ranging between 20° C. and 40° C.

* * * * *